(12) United States Patent
Shizuno

(10) Patent No.: US 8,659,019 B2
(45) Date of Patent: Feb. 25, 2014

(54) SEMICONDUCTOR DEVICE

(75) Inventor: Yoshinori Shizuno, Kanagawa (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 95 days.

(21) Appl. No.: 12/382,338

(22) Filed: Mar. 13, 2009

(65) Prior Publication Data

US 2009/0267209 A1 Oct. 29, 2009

(30) Foreign Application Priority Data

Apr. 25, 2008 (JP) ................. 2008-115647

(51) Int. Cl.
*H01L 23/48* (2006.01)
*H01L 23/02* (2006.01)

(52) U.S. Cl.
USPC ...... 257/49; 257/686; 257/698; 257/E23.011; 257/E23.18

(58) Field of Classification Search
USPC .......................................... 257/49
See application file for complete search history.

(56) References Cited

U.S. PATENT DOCUMENTS

| | | | |
|---|---|---|---|
| 6,276,079 B1 * | 8/2001 | Tijanic | 40/591 |
| 2004/0104478 A1 * | 6/2004 | Noguchi | 257/738 |
| 2006/0249737 A1 * | 11/2006 | Fujimori | 257/79 |
| 2006/0252174 A1 * | 11/2006 | Maeda et al. | 438/75 |

FOREIGN PATENT DOCUMENTS

| | | |
|---|---|---|
| JP | 2004-31498 | 1/2004 |
| JP | 2004-179495 | 6/2004 |
| JP | 2007-67017 | 3/2007 |

* cited by examiner

*Primary Examiner* — Jarrett Stark
*Assistant Examiner* — Lawrence Tynes, Jr.
(74) *Attorney, Agent, or Firm* — Rabin & Berdo, P.C.

(57) ABSTRACT

At a semiconductor device, an integrated circuit including an optoelectronic conversion device is formed on a front face of a sensor chip. A rewiring layer, which leads from pad electrodes, and post electrodes, on the rewiring layer, are formed on the sensor chip. At least a portion of surroundings of the rewiring layer and the post electrodes is sealed with sealing resin, so as to be open above the integrated circuit face. A light-transmissive substrate is disposed over the sealed sensor chip. Penetrating electrodes, corresponding with positions of the post electrodes disposed on the sensor chip, are formed in the light-transmissive substrate, and external terminals such as solder balls or the like are formed so as to electrically connect with the penetrating electrodes.

18 Claims, 4 Drawing Sheets

SEMICONDUCTOR DEVICE

CROSS-REFERENCE TO RELATED APPLICATION

This application claims priority under 35 USC 119 from Japanese Patent Application No. 2008-115647, the disclosure of which is incorporated by reference herein.

BACKGROUND OF THE INVENTION

1. Field of the Invention

The present invention relates to a semiconductor device that includes a light-sensing region in an integrated circuit, and another integrated circuit or the like, the light-sensing region being constituted by, for example, an optoelectronic conversion device (for example, a solid state imaging device such as a CCD (charge coupled device), a CMOS (complementary metal oxide semiconductor) sensor or the like, or a light-sensing element or the like).

2. Description of Related Art

In association with year-by-year increases in pixel numbers of, for example, portable camera modules, reductions in heights of profiles are progressing. Miniaturization of built-in sensor components is also required. When mounting sensors, the wire bonding method, the flip chip method and the like have been employed, but a method of packaging a sensor as a chip scale package has emerged. This method is a useful technique for increasing density, because substrate mounting in the area of a chip is possible.

Various methods are available for these sensor CSPs. There is a method of broadly dividing wafer-level CSPs fabricated in the form of a wafer and forming wiring at a package side face thereof, and there is the TSV (through Si via) method of providing through holes in a sensor chip.

Japanese patent application laid-open (JP-A) No. 2004-179495 has proposed a package that is provided with a light-transmissive cap and that both realizes ultra-small packaging and has good endurance.

However, while the sensor CSP illustrated in JP-A No. 2004-179495 is a thoroughly excellent CSP, it is necessary to provide the light-transmissive cap at each sensor chip, which is a little disadvantageous for mass production. Moreover, the sensor CSP illustrated in JP-A No. 2004-179495 is disposed by being engaged with steps on columnar electrodes. Therefore, it is necessary to separately reserve a region for sealing with sealing resin, and further miniaturization is difficult. Further yet, this is limited to packages for sensor chips with small sensor areas, but if a region of sealing with sealing resin is reduced for the sake of miniaturization, anti-moisture characteristics deteriorate.

SUMMARY

Accordingly, an object of the present invention is to provide a semiconductor device that is not limited by a type of semiconductor chip, that is excellent for mass production and achieves miniaturization, and that reliably assures anti-moisture characteristics, and a fabrication method thereof.

The object described above is achieved by the following means.

A first aspect of the present invention provides a semiconductor device including:

a first semiconductor chip, at a first main face of which an integrated circuit is formed;

columnar electrodes that are disposed at the first main face side of the first semiconductor chip and that are electrically connected with the integrated circuit;

a light-transmissive substrate disposed at the first main face side of the first semiconductor chip, with a predetermined gap therebetween;

substrate penetrating electrodes that are disposed to penetrate through the light-transmissive substrate between a face opposing the first semiconductor chip and a face not opposing the first semiconductor chip and that are electrically connected with the columnar electrodes;

sealing resin that seals at least a portion of the gap between the first semiconductor chip and the light-transmissive substrate; and external terminals that are provided at the side of the light-transmissive substrate of the face not opposing the first semiconductor chip and that are electrically connected with the penetrating electrodes.

A second aspect of the present invention provides a semiconductor device according to the first aspect, further including:

chip penetrating electrodes that are disposed to penetrate through the first semiconductor chip; and a second semiconductor chip that is disposed at a second main face side of the first semiconductor chip and that is electrically connected with the chip penetrating electrodes.

According to the present invention, a semiconductor device that is not limited by a type of semiconductor chip, that is excellent for mass production and achieves miniaturization, and that reliably assures anti-moisture characteristics, and a fabrication method thereof, are provided.

BRIEF DESCRIPTION OF THE DRAWINGS

Preferred exemplary embodiments of the present invention will be described in detail based on the following figures, wherein.

DETAILED DESCRIPTION OF THE INVENTION

Figure 1A:
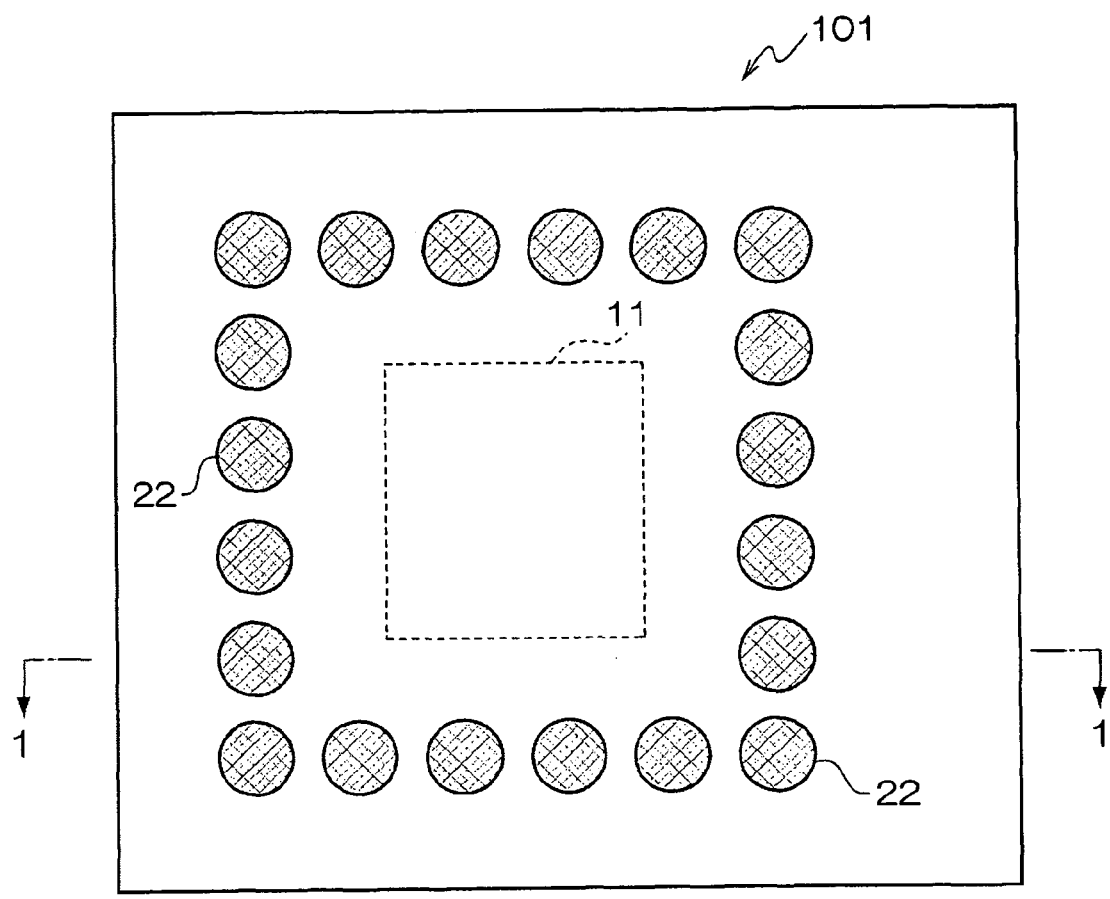
FIG. 1A is a schematic structural plan view showing structure of a semiconductor chip relating to a first exemplary embodiment.

Hereafter, exemplary embodiments of the present invention will be described with reference to the drawings. Herein, portions that have substantially the same functions are described with the same reference numerals assigned throughout the drawings, and descriptions thereof may be omitted as appropriate.

First Exemplary Embodiment

Figure 1B:
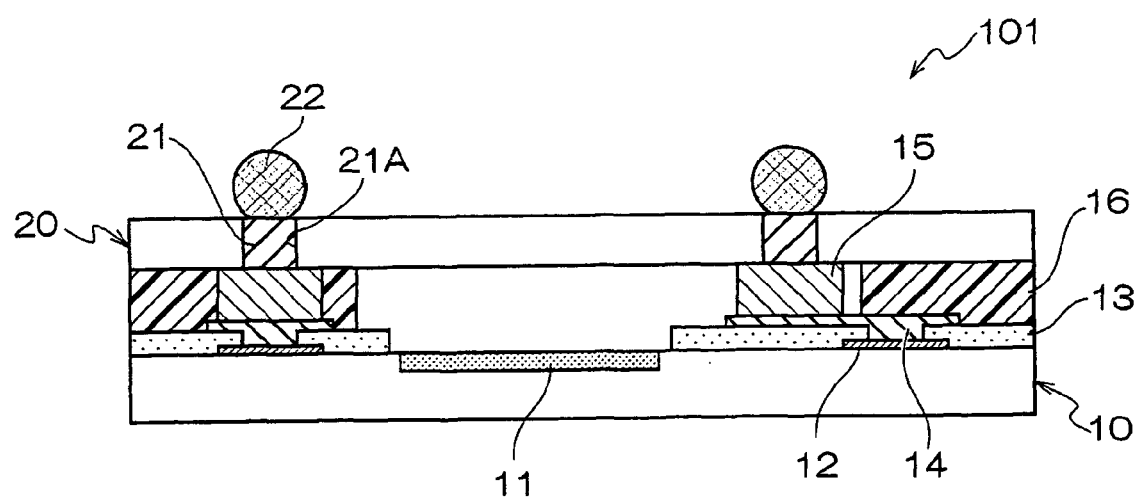
FIG. 1B is a sectional view cut along 1-1 of FIG. 1A.

FIG. 1A and FIG. 1B are schematic structural views showing structure of a semiconductor chip relating to a first exemplary embodiment. FIG. 1A is a plan view, and FIG. 1B is a sectional view cut along 1-1 of FIG. 1A.

As shown in FIG. 1A and FIG. 1B, a semiconductor device 101 relating to the first exemplary embodiment includes a sensor chip 10 (a first semiconductor chip) at a first main surface of which (a surface opposing a light-transmissive substrate) an integrated circuit is formed, which includes an optoelectronic conversion device (for example, a solid state imaging device such as a CCD (charge coupled device), a CMOS (complementary metal oxide semiconductor) sensor or the like, or a light-sensing element or the like). Because this integrated circuit includes an optoelectronic conversion device, it may hereinafter be referred to as a light-sensing region, which region is indicated with an '11' in the drawings. Pad electrodes 12 are formed on the sensor chip 10 and are electrically connected with the integrated circuit. An insulation film 13 (for example, a passivation film) is formed so as to expose a face of the integrated circuit and portions of the pad electrodes 12.

A rewiring layer 14, which leads from the pad electrodes 12, is formed in the semiconductor device 101, and post electrodes 15 (columnar electrodes) are formed on the rewiring layer 14. The post electrodes 15 are formed in the vicinity of peripheral edges of the integrated circuit face. Provided the post electrodes 15 are in a region outside the integrated circuit face, the post electrodes 15 may be formed directly on the pad electrodes 12, and may be formed in arbitrary regions on lines of the rewiring layer 14. The post electrodes 15 may be formed on the sensor chip 10 with symmetry, for example, linear symmetry or point symmetry about the integrated circuit face or the like, and may be formed non-symmetrically, for example, biased to an arbitrary side of the integrated circuit face or the like.

The sensor chip 10 is sealed with sealing resin 16 enclosing the rewiring layer 14 and the post electrodes 15, so as to be open above the integrated circuit face. The sealing resin 16 does not necessarily completely enclose the rewiring layer 14 and the post electrodes 15, and may seal only the surroundings of portions of the rewiring layer 14 and the post electrodes 15. Further, if the sealing resin 16 is a material that transmits the light that is sensed by the integrated circuit (meaning a material that will not affect optical characteristics of the sensor chip 10), the sealing resin 16 may completely seal over the sensor chip 10.

A light-transmissive substrate 20 is disposed above the sensor chip 10 sealed with the sealing resin 16. That is, the light-transmissive substrate 20 is disposed with a predetermined gap from the sensor chip 10, with the sealing resin 16 therebetween. The light-transmissive substrate 20 is a substrate with the same size and shape as the sensor chip 10. The light-transmissive substrate 20 may be constituted with a glass or other ceramic, or a transparent resin, silicon or the like, and may be constituted with a material having the function of a UV-cutting filter. The light-transmissive substrate 20 may also function as a lens if it causes a focusing point to coincide with the light-sensing region.

Through holes 21A are formed in the light-transmissive substrate 20. The through holes 21A penetrate through the light-transmissive substrate 20 in a thickness direction, in correspondence with positions of the post electrodes 15 arranged on the sensor chip 10. Penetrating electrodes 21 are embedded in the through holes 21A. The penetrating electrodes 21 embedded in the through holes 21A are electrically joined, at the side of a face of the light-transmissive substrate 20 that opposes the sensor chip 10, to end faces of the post electrodes 15. The electrical joining between the penetrating electrodes 21 and the post electrodes 15 may be joining utilizing a conductive adhesive, and may be adhesiveless joining not utilizing a conductive adhesive. Joining together of other electrodes is similar.

External terminals 22, such as solder balls or the like, are formed at the light-transmissive substrate 20 so as to be electrically connected with the penetrating electrodes 21 embedded in the through holes 21A. The external terminals 22 may be directly disposed on the penetrating electrodes 21, and may be disposed at arbitrary locations on a final wiring layer that may be formed on the light-transmissive substrate 20 to lead from the penetrating electrodes 21.

Below, a method of fabrication of the semiconductor device 101 relating to the present exemplary embodiment is described. FIGS. 2A to 2F are process diagrams describing the fabrication method of the semiconductor chip relating to the first exemplary embodiment.

Figure 2A:
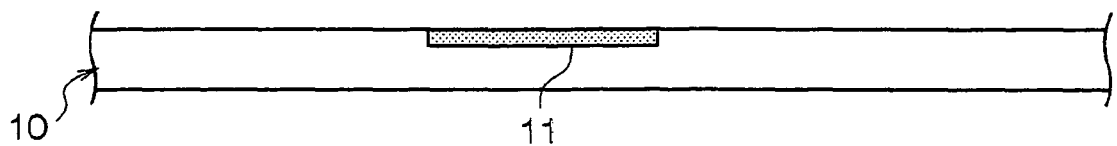
FIG. 2A to FIG. 2F are process diagrams describing a fabrication method of the semiconductor chip relating to the first exemplary embodiment.

Firstly, as shown in FIG. 2A, a first main face of a silicon wafer is divided into a plurality of element regions, at each region, an integrated circuit 11 is formed by semiconductor processes. Thus, a silicon wafer 10A, which is an aggregation of sensor chips 10, is prepared.

Figure 2B:
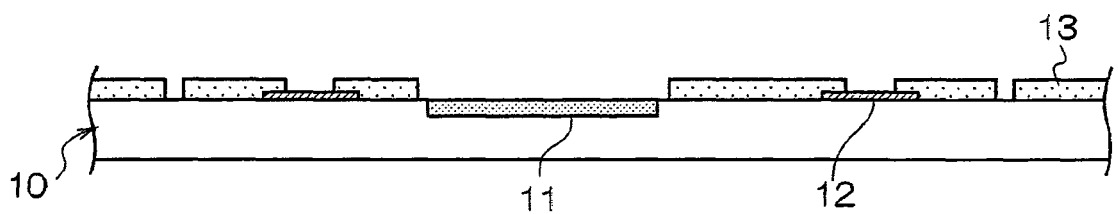

Then, as shown in FIG. 2B, the pad electrodes 12, formed of aluminium, are formed by, for example, forming a mask by applying, exposing and etching a resist and then sputtering, plating or the like, and the resist is removed and washed off. Then the insulation film 13, formed of a silicon nitride film, is formed on the first main face of the silicon wafer 10A so as to cover the integrated circuit face and the pad electrodes 12, and the insulation film 13 is removed so as to expose portions of the pad electrodes 12 and the integrated circuit face. Thus, opening portions are formed in the insulation film 13. The insulation film 13 is also removed and opening portions formed therein along dicing lines of the silicon wafer 10A. The insulation film 13 is formed by, for example, a chemical vapor deposition process using plasma of the silicon nitride film (plasma-assisted chemical vapor deposition, P-CVD), using $SiH_4$, $NH_3$ and $N_2$ as feed gases. The opening portions in the insulation film 13 are formed by, for example, forming a mask by applying, exposing and etching a resist on the insulation film 13, and then etching the insulation film 13.

Figure 2C:
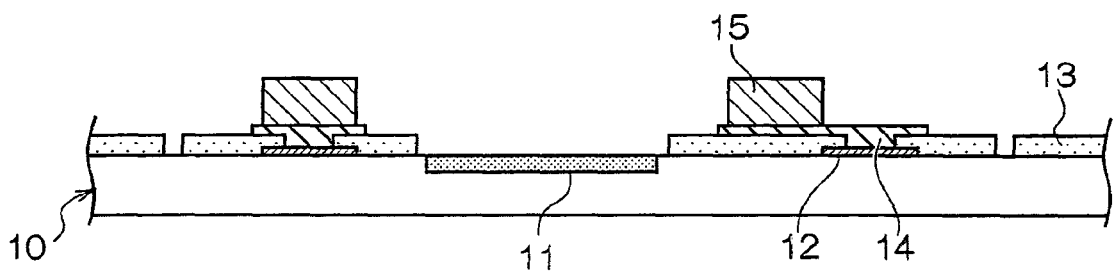

Then, as shown in FIG. 2C, the rewiring layer 14, formed of copper, is formed by, for example, forming a mask on the silicon wafer 10A by applying, exposing and etching a resist and then sputtering, plating or the like, and the resist is removed and washed off. Similarly, the post electrodes 15, formed of copper, are formed by forming a mask on the silicon wafer 10A by applying, exposing and etching a resist and then sputtering, plating or the like, and the resist is removed and washed off. After the post electrodes 15 are formed, the post electrode heights may be made uniform by mechanical polishing. For this polishing, for example, a SURFACE PLANER DFS8910, produced by DISCO Corporation, or the like is excellently employed. Thus, making the gap between the sensor chip 10 and the light-transmissive substrate constant is facilitated.

Figure 2D:
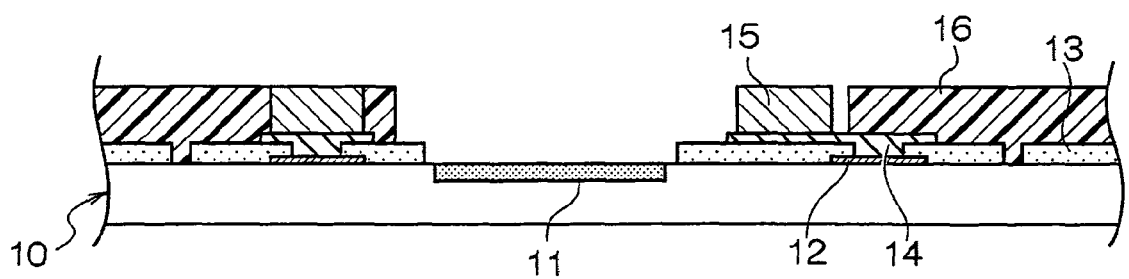

Then, as shown in FIG. 2D, surroundings of the rewiring layer 14 and the post electrodes 15 are sealed with the sealing resin 16, so as to be open above the integrated circuit face. As a concrete example, a liquid sealing resin 16 (for example, CRX-2580P, produced by Sumitomo Bakelite Co., Ltd., or the like) is applied over the silicon wafer 10A by spin coating or the like, and the whole of the silicon wafer 10A is temporarily sealed with the sealing resin 16. Thereafter, the region at which the integrated circuit is formed, and other regions are etched and opened up by photolithography processing or the like. Thus, the surface of the silicon wafer 10A is sealed with this sealing resin 16. Before or after formation of the openings, the sealing resin 16 is subjected to mechanical polishing of the surface (cutting, grinding, buffing or the like) or the like, and the thickness of the sealing resin 16 is made uniform and the post electrodes 15 covered by the sealing resin 16 are exposed. Thus, making the gap between the sensor chip 10 and the light-transmissive substrate constant is facilitated.

Figure 2E:
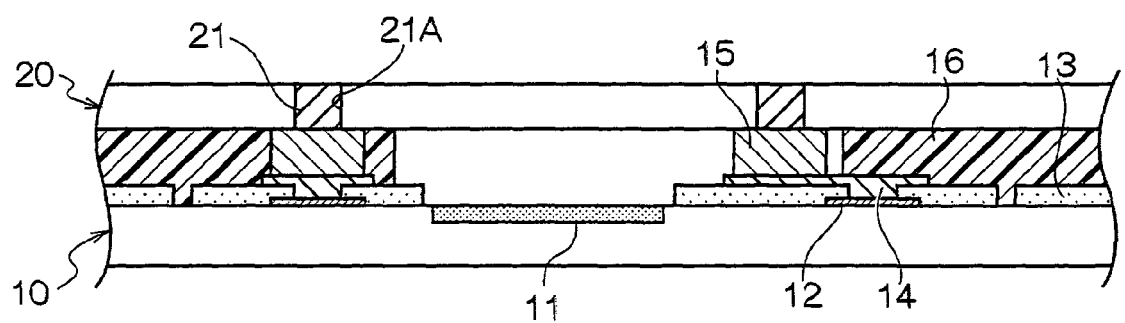

Then, as shown in FIG. 2E, an adhesive (not shown) is applied onto the silicon wafer 10A (the sensor chip 10) that has been sealed with the sealing resin 16, after which a light-transmissive wafer 20A with size and shape equal to the silicon wafer 10A is stuck thereon. This light-transmissive wafer serves as the light-transmissive substrate 20. After the light-transmissive wafer 20A has been stuck on, the through holes 21A are formed in the light-transmissive wafer 20A at positions corresponding with the positions of the post electrodes 15, by a laser or the like. Thereafter, a conductive material such as silver paste or the like is embedded in the through holes 21A, forming the penetrating electrodes 21.

Here, an adhesive adhesion sheet may be employed when sticking on the light-transmissive wafer 20A. Accordingly, the step of applying adhesive may be omitted. Furthermore, the through holes 21A may be formed in the light-transmissive wafer 20A (the light-transmissive substrate 20) in advance, prior to it being stuck on. Accordingly, formation of the through holes 21A with a laser is made easier.

Figure 2F:
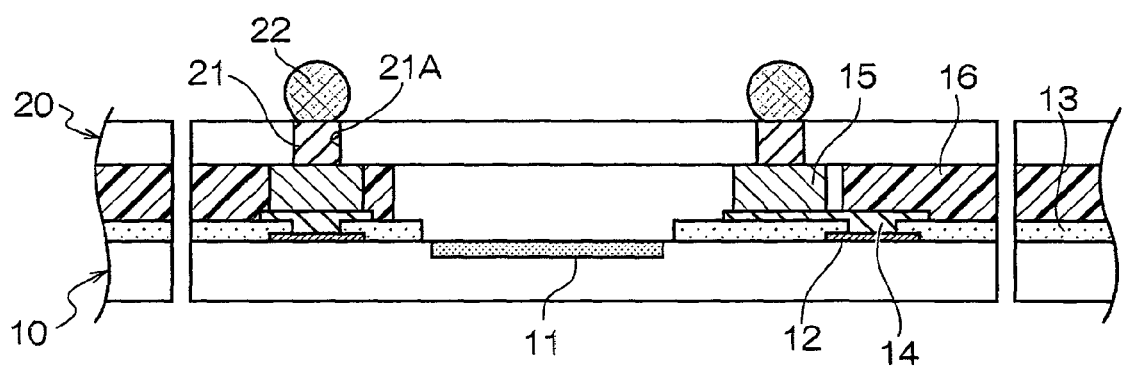

Then, as shown in FIG. 2F, the external terminals 22 are formed of solder balls or the like so as to electrically connect with the penetrating electrodes 21, after which a scribe cuts along the dicing lines.

By the above steps, the semiconductor device 101 relating to the present exemplary embodiment is provided.

The semiconductor device 101 relating to the present exemplary embodiment described hereabove is structured so as to implement exchanges of signals and the like with the exterior of the sensor chip 10 through the penetrating electrodes 21 disposed in the light-transmissive substrate 20. Accordingly, because the light-transmissive wafer 20A structuring the light-transmissive substrate 20 may be provided by being stuck on the sensor chip 10 at the wafer level (i.e., the silicon wafer 10A), there is no need to stick the light-transmissive substrate 20 on the individual sensor chips 10.

Furthermore, the semiconductor device 101 relating to the present exemplary embodiment has a structure in which the light-transmissive substrate 20 is stuck on over the sealing resin 16. Therefore, there is no need to separately reserve a region for sealing with the sealing resin 16, and even if a region of the sensor chip 10 at which the integrated circuit is formed is large, space for sealing with the sealing resin 16 may be reliably assured. Thus, miniaturization may be realized with space for sealing with the sealing resin 16 being well assured.

Therefore, the semiconductor device 101 relating to the present exemplary embodiment is not limited by a type of the sensor chip 10 (the first semiconductor chip), is excellent for mass production and achieves miniaturization, and reliably assures anti-moisture characteristics.

Second Exemplary Embodiment

Figure 3:
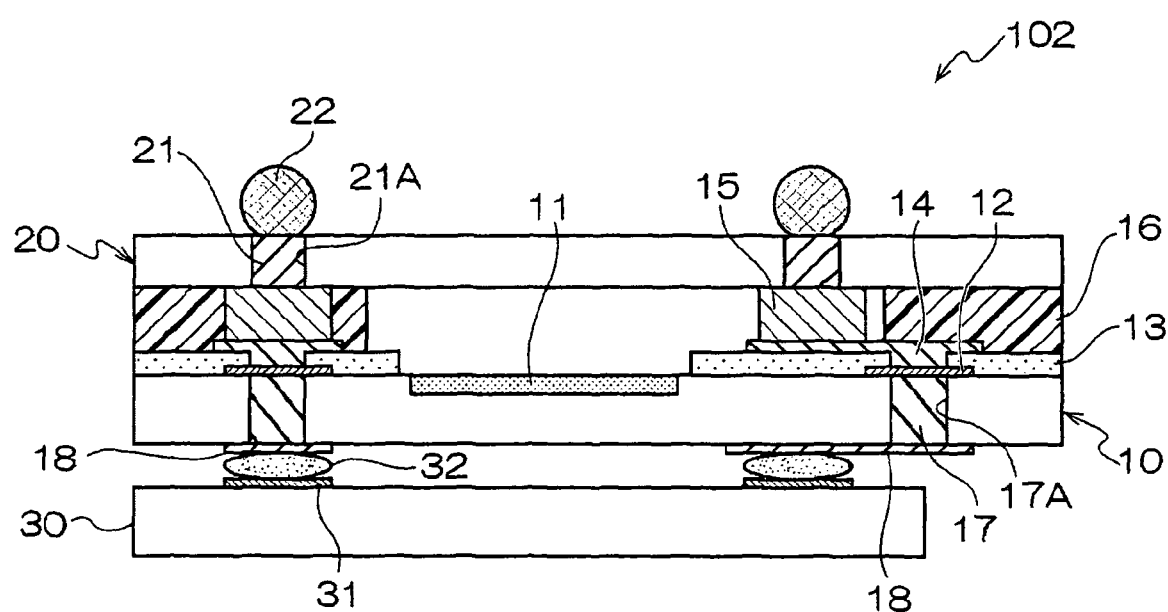
FIG. 3 is a schematic sectional view showing a semiconductor device 102 relating to a second exemplary embodiment.

FIG. 3 is a schematic sectional view showing a semiconductor device 102 relating to a second exemplary embodiment.

As shown in FIG. 3, the semiconductor device 102 relating to the second exemplary embodiment is a mode in which a semiconductor chip 30 (a second semiconductor chip), of a different type from the sensor chip 10, is disposed at a second main face side of the sensor chip 10 of the first exemplary embodiment (the face thereof that does not oppose the light-transmissive substrate).

Specifically, through holes 17A penetrating in the thickness direction are formed in the sensor chip 10, and penetrating electrodes 17 are embedded in the through holes 17A. The through holes 17A are provided so as to expose, for example, the pad electrodes 12 through the second main face side of the sensor chip 10. The penetrating electrodes 17 are formed by embedding a conductive material such as silver paste or the like in the through holes 17A, and conduction to the pad electrodes 12 is enabled. A wiring layer 18 that leads from the penetrating electrodes 17 is formed at the second main face side of the sensor chip 10. The through holes 17A may be formed by employing a dry etching process, a wet etching process or a laser process, and cutting until the pad electrodes 12 are exposed.

Here, the through holes 17A in the sensor chip 10 are disposed directly below the rewiring layer 14, with the pad electrodes 12 therebetween. Therefore, the pad electrodes 12 are reinforced by the rewiring layer 14, and breakages, peeling or the like of the electrodes is suppressed.

The semiconductor chip 30 which differs from the sensor chip 10 is disposed at the second main face side of the sensor chip 10, with pad electrodes 31 of the semiconductor chip 30 being electrically connected with the wiring layer 18 through a conductive adhesive 32 such as solder or the like.

The semiconductor chip 30 implements exchanges of signals and the like with the exterior through the external terminals 22 provided on the light-transmissive substrate 20 and the penetrating electrodes 21, the penetrating electrodes 17 and post electrodes 15 provided at the sensor chip 10, and so forth. As examples of the semiconductor chip 30, DSPs (digital signal processors), memory and the like may be mentioned. The size of the semiconductor chip 30 is not particularly limited; it may be the same size as the sensor chip 10, and may be larger or smaller than the sensor chip 10.

Other respects are the same as the first exemplary embodiment so will not be described.

The semiconductor device 102 relating to the present exemplary embodiment described hereabove has a function of implementing exchanges of signals and the like with the exterior of the sensor chip 10 through the penetrating electrodes 21 provided in the light-transmissive substrate 20, and the external terminals 22 and so forth, and at the second main face side of the sensor chip 10, the semiconductor chip 30 is packaged to conduct through the penetrating electrodes 17. Therefore, the semiconductor chip 30 may be packaged without penetrating electrodes (and through holes) therein and a top wiring layer or the like being provided. Hence, a reduction in costs in high-density packaging, in which plural chips are packaged, is realized. Furthermore, because the semiconductor chip 30 is electrically connected by the penetrating electrodes 21 of the sensor chip 10, wiring distances may be kept short.

In particular, in a case in which a DSP (Digital signal processor) is applied as the semiconductor chip 30, when the semiconductor device 101 is employed in a camera module or the like, because of the semiconductor device 101 being disposed horizontally on a mounting substrate or the like, applicability of the high-density packaging is high, and the wiring being short is advantageous for high-speed processing and anti-noise measures.

In a case in which memory is applied as the semiconductor chip 30, acquisition of image data at higher speeds is enabled by dedicated memory being three-dimensionally wired to an image processing circuit of the sensor chip 10. With a CMOS sensor, high-speed shutter functions are disadvantaged compared with CCD. Therefore, in this case, improvements in functions such as high-speed shuttering, acquisition of further images and suchlike, and the like are enabled.

For the present exemplary embodiment, a mode in which two semiconductor chips are packaged has been described. However, modes are also possible in which three or more semiconductor chips are packaged. For example, as well as the second semiconductor chip 30, the penetrating electrodes 17 are provided in the same manner as for the semiconductor chip 30 and a third semiconductor chip is packaged or the like.

Obviously the respective exemplary embodiments hereabove are not to be interpreted restrictively and may be implemented within a scope satisfying the requirements of the present invention.

What is claimed is:

1. A semiconductor device comprising:
   a first semiconductor chip having a first main face, an integrated circuit being formed at the first main face;
   columnar electrodes disposed at a first main face side of the first semiconductor chip and being electrically connected with the integrated circuit;
   a light-transmissive substrate disposed at the first main face side of the first semiconductor chip, with a predetermined gap therebetween;
   substrate penetrating electrodes disposed on the columnar electrodes to penetrate through the light-transmissive substrate between a face opposing the first semiconductor chip and a face not opposing the first semiconductor chip and being electrically connected with the columnar electrodes;
   sealing resin that seals at least a portion of the gap between the first semiconductor chip and the light-transmissive substrate such that the light-transmissive substrate is disposed directly on the sealing resin, the sealing resin being disposed so that one of the columnar electrodes has entire side surfaces thereof directly covered by the sealing resin; and
   external terminals provided at a side of the light-transmissive substrate of the face not opposing the first semiconductor chip and being electrically connected with the penetrating electrodes.

2. The semiconductor device according to claim 1, further comprising:
   chip penetrating electrodes that are disposed to penetrate through the first semiconductor chip; and
   a second semiconductor chip that is disposed at a second main face side of the first semiconductor chip and that is electrically connected with the chip penetrating electrodes.

3. The semiconductor device according to claim 2, wherein the external terminals are disposed on the substrate penetrating electrodes.

4. The semiconductor device according to claim 1, wherein the substrate penetrating electrodes are electrically joined with end faces of the columnar electrodes at a side of the light-transmissive substrate of the face opposing the first semiconductor chip.

5. The semiconductor device according to claim 1, wherein the first semiconductor chip includes:
   pads that are electrically connected with the integrated circuit; and
   a rewiring layer that is electrically connected with the pads, and the columnar electrodes are disposed on the rewiring layer.

6. The semiconductor device according to claim 1, wherein the external terminals are disposed on the substrate penetrating electrodes.

7. The semiconductor device according to claim 1, wherein the light-transmissive substrate is disposed directly above the sealing resin.

8. The semiconductor device according to claim 1, wherein the face opposing the first semiconductor chip of the light-transmissive substrate contacts the sealing resin.

9. The semiconductor device according to claim 1, wherein the gap is delimited by the face opposing the first semiconductor chip of the light-transmissive substrate and the first semiconductor chip.

10. The semiconductor device according to claim 1, wherein every part of the light-transmissive substrate allows light to pass therethrough, and the substrate penetrating electrodes touch the light-transmissive substrate.

11. The semiconductor device according to claim 1, wherein the one columnar electrode has first and second side surfaces opposite each other, each of the entire first side surface and the entire second side surface being in direct contact with the sealing resin.

12. The semiconductor device according to claim 1, wherein a second of the columnar electrodes is separated from all of the sealing resin.

13. A semiconductor device comprising:
   a semiconductor chip including an integrated circuit;
   columnar electrodes disposed on a semiconductor side of the semiconductor chip and being electrically connected with the semiconductor chip;
   a light-transmissive substrate disposed on the semiconductor side so as to form a gap between the light-transmissive substrate and the semiconductor chip, the light-transmissive substrate including opposing faces, a first of the opposing faces facing the semiconductor chip and a second of the opposing faces facing away from the semiconductor chip;
   substrate penetrating electrodes that are disposed on the columnar electrodes and penetrate the light-transmissive substrate between the opposing faces and being electrically connected with the columnar electrodes;
   sealing resin contacting the first opposing face and disposed so as to seal at least a portion of the gap between the semiconductor chip and the light-transmissive substrate, the light-transmissive substrate being disposed directly on and over the sealing resin so as to contact the sealing resin, the sealing resin being disposed so that one of the columnar electrodes has entire side surfaces thereof directly covered by the sealing resin; and
   external terminals provided at a side of the second opposing face and being electrically connected with the penetrating electrodes.

14. The semiconductor device according to claim 13, wherein the first opposing face touches the sealing resin.

15. The semiconductor device according to claim 13, wherein the gap is delimited by the first opposing face and the semiconductor chip.

16. The semiconductor device according to claim 13, wherein every part of the light-transmissive substrate allows light to pass therethrough, and the substrate penetrating electrodes touch the light-transmissive substrate.

17. The semiconductor device according to claim 13, wherein the one columnar electrode has first and second side surfaces opposite each other, each of the entire first side surface and the entire second side surface being in direct contact with the sealing resin.

18. The semiconductor device according to claim 13, wherein a second of the columnar electrodes is separated from all of the sealing resin.

* * * * *